(12) United States Patent
Lung

(10) Patent No.: US 10,672,469 B1
(45) Date of Patent: Jun. 2, 2020

(54) IN-MEMORY CONVOLUTION FOR MACHINE LEARNING

(71) Applicant: MACRONIX INTERNATIONAL CO., LTD., Hsinchu (TW)

(72) Inventor: Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/205,743

(22) Filed: Nov. 30, 2018

(51) Int. Cl.
    *G11C 11/00* (2006.01)
    *G11C 13/00* (2006.01)
    *G06N 3/04* (2006.01)
    *G06N 20/00* (2019.01)

(52) U.S. Cl.
    CPC ........ *G11C 13/004* (2013.01); *G11C 13/0069* (2013.01); *G06N 3/04* (2013.01); *G06N 20/00* (2019.01)

(58) Field of Classification Search
    CPC .. G11C 13/004; G11C 13/0069; G06N 20/00; G06N 3/04
    See application file for complete search history.

(56) References Cited

U.S. PATENT DOCUMENTS

| | | | |
|---|---|---|---|
| 4,219,829 A | 8/1980 | Dorda et al. | |
| 4,987,090 A | 1/1991 | Hsu et al. | |
| 5,301,162 A * | 4/1994 | Shimizu | G06F 12/0893 365/189.07 |
| 5,586,073 A | 12/1996 | Hiura et al. | |
| 6,107,882 A | 8/2000 | Gabara et al. | |
| 6,313,486 B1 | 11/2001 | Kencke et al. | |
| 6,829,598 B2 | 12/2004 | Milev | |
| 6,906,940 B1 | 6/2005 | Lue | |
| 6,960,499 B2 | 11/2005 | Nandakumar et al. | |
| 7,019,998 B2 | 3/2006 | Tran et al. | |
| 7,368,358 B2 | 5/2008 | Duyang et al. | |
| 7,747,668 B2 | 6/2010 | Nomura et al. | |
| 8,203,187 B2 | 6/2012 | Lung et al. | |
| 8,275,728 B2 | 9/2012 | Pino | |

(Continued)

FOREIGN PATENT DOCUMENTS

| CN | 1998012 B | 11/2010 |
|---|---|---|
| TW | 201721655 A | 6/2017 |

(Continued)

OTHER PUBLICATIONS

EP Extended Search Report from 18155279.5-1203 dated Aug. 30k 2018, 8 pages.

(Continued)

*Primary Examiner* — Pho M Luu
(74) *Attorney, Agent, or Firm* — Haynes Beffel & Wolfeld LLP

(57) ABSTRACT

A device comprises a first block of memory cells, a second block of memory cells to store a feature array, and a third block of memory cells to store an array of output values. Sensing circuitry is coupled to the first block of memory cells and the second block of memory cells to compare electrical differences between the memory cells in the first block and the memory cells in the second block to generate the array of output values. Writing circuitry is operatively coupled to the third block to store the array of output values in the third block of memory cells.

23 Claims, 12 Drawing Sheets

(56) References Cited

U.S. PATENT DOCUMENTS

| | | | |
|---|---|---|---|
| 8,386,884 B2* | 2/2013 | Chen | G06F 11/1072 365/185.03 |
| 8,432,719 B2 | 4/2013 | Lue | |
| 8,589,320 B2 | 11/2013 | Breitwisch et al. | |
| 8,630,114 B2 | 1/2014 | Lue | |
| 8,750,042 B2 | 6/2014 | Sharon et al. | |
| 8,860,124 B2 | 10/2014 | Lue et al. | |
| 9,064,903 B2 | 6/2015 | Mitchell et al. | |
| 9,244,767 B1* | 1/2016 | D'Abreu | G06F 11/1072 |
| 9,431,099 B2 | 8/2016 | Lee et al. | |
| 9,524,980 B2 | 12/2016 | Lue | |
| 9,589,982 B1 | 3/2017 | Cheng et al. | |
| 9,698,156 B2 | 7/2017 | Lue | |
| 9,698,185 B2 | 7/2017 | Chen et al. | |
| 9,710,747 B2 | 7/2017 | Kang et al. | |
| 2003/0122181 A1 | 7/2003 | Wu | |
| 2005/0287793 A1 | 12/2005 | Blanchet et al. | |
| 2010/0182828 A1 | 7/2010 | Shima et al. | |
| 2010/0202208 A1 | 8/2010 | Endo et al. | |
| 2011/0063915 A1 | 3/2011 | Tanaka et al. | |
| 2011/0106742 A1 | 5/2011 | Pino | |
| 2011/0286258 A1 | 11/2011 | Chen et al. | |
| 2012/0044742 A1 | 2/2012 | Narayanan | |
| 2012/0235111 A1 | 9/2012 | Osano et al. | |
| 2013/0075684 A1 | 3/2013 | Kinoshita et al. | |
| 2014/0119127 A1 | 5/2014 | Lung et al. | |
| 2014/0268996 A1 | 9/2014 | Park | |
| 2015/0008500 A1 | 1/2015 | Fukumoto et al. | |
| 2016/0181315 A1 | 6/2016 | Lee et al. | |
| 2016/0308114 A1 | 10/2016 | Kim et al. | |
| 2016/0336064 A1 | 11/2016 | Seo et al. | |
| 2017/0092370 A1 | 3/2017 | Harari | |
| 2017/0148517 A1 | 5/2017 | Harari | |
| 2017/0162273 A1 | 6/2017 | You et al. | |
| 2017/0169887 A1 | 6/2017 | Widjaja | |
| 2017/0270405 A1 | 9/2017 | Kurokawa | |
| 2018/0007302 A1 | 1/2018 | Meixner et al. | |
| 2018/0025777 A1* | 1/2018 | Jacobvitz | G11C 29/52 714/764 |

FOREIGN PATENT DOCUMENTS

| | | |
|---|---|---|
| TW | 201802767 A | 1/2018 |
| TW | 201802800 A | 1/2018 |
| WO | 2012015450 A1 | 2/2012 |
| WO | 2017091338 A1 | 6/2017 |

OTHER PUBLICATIONS

EP Extended Search Report from EP18158099.4 dated Sep. 19, 2018, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent—copy not provided herewith).

Ohzone et al., "Ion-Implanted Thin Polycrystalline-Silicon High-Value Resistors for High-Density Poly-Load Static RAM Applications," IEEE Trans. On Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H, et al., "Bit Cost Scalable Technology with Punch and Plug Process for Ultra High Density Flash Memory," 2007 Symp. VLSI Tech., Digest of Tech. Papers, pp. 14-15.

Office Action in U.S. Appl. No. 15/887,166 dated Jan. 30, 2019, 18 pages.

U.S. Appl. No. 15/873,369, filed Jan. 17, 2018, entitled "Sum-Of-Products Accelerator Array," Lee et al., 52 pages.

U.S. Appl. No. 15/887,166, filed Feb. 2, 2018, entitled "Sum-Of-Products Array for Neuromorphic Computing System," Lee et al., 49 pages.

U.S. Appl. No. 15/895,369, filed Feb. 13, 2018, entitled "Device Structure for Neuromorphic Computing System," Lin et al., 34 pages.

U.S. Appl. No. 15/922,359, filed Mar. 15, 2018, entitled "Voltage Sensing Type of Matrix Multiplication Method for Neuromorphic Computing System, " Lin et al., 40 pages.

U.S. Appl. No.. 16/037,281, filed Jul. 17, 2018, 87 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

TW Office Action from 10821185230 with English Translation dated Dec. 12, 2019, 8 pages.

* cited by examiner

IN-MEMORY CONVOLUTION FOR MACHINE LEARNING

BACKGROUND

Field

The present invention relates to circuitry that can be used to perform in-memory convolution for machine learning.

Description of Related Art

Convolutional neural networks (CNN) are used in machine learning with applications in fields such as speech recognition, computer vision and text processing. CNN operations can be implemented using a system that includes graphics processing units (GPU) and dynamic random access memory (DRAM) coupled to the GPU. In such a system, data is frequently moved between multiple GPUs and DRAMs for convolutional operations, through components on printed circuit boards such as conductive traces and pads. However, such data movement can consume a significant amount of power and slow down the performance.

It is desirable to provide a device for convolutional operations that can improve the performance and reduce power consumption.

SUMMARY

A device is provided that comprises a first block of memory cells, a second block of memory cells to store a feature array, and a third block of memory cells to store an array of output values. Sensing circuitry is coupled to the first block of memory cells and the second block of memory cells to compare electrical differences between the memory cells in the first block and the memory cells in the second block to generate the array of output values. Writing circuitry operatively coupled to the third block can store the array of output values in the third block of memory cells.

As used herein, an analog level can be stored without verify cycles to verify that the cell has been changed to the target resistance or threshold range corresponding to a particular digital value. Storing output values in the fifth block of memory cells as analog levels instead of digital values can improve the performance for storing the output values in the array of output values, because the verify cycles are not needed.

As used herein, "in-place convolution" refers to convolution of a function of a filter array over an input array to generate an array of output values, where the filter array and the input array are stored in an addressable memory before the convolution, the convolution is executed while the filter array and the input array remain stored in the same addressable memory, and are not moved to another addressable memory before or during the execution of the convolution.

For a set of frames of cells in the first block, the sensing circuitry is configured to compare electrical differences between the feature array with each frame in the set of frames to generate the array of output values, where each value in the array of output values corresponds to a frame in the set of frames, and indicates electrical differences between analog values from its corresponding frame and analog values from the feature array. The device includes address generation circuits that apply addresses for the set of frames and the feature array to the first block and the second block in coordination with the sensing circuitry comparing the electrical differences.

In one embodiment, the first block can be configured to store an input array. In an alternative embodiment, the device can further comprise a fourth block of memory cells to store a filter array, and a fifth block of memory cells to store an input array. Convolution circuitry operatively coupled to the fourth block of memory cells and the fifth block of memory cells can execute in-place convolution of a function of the filter array over the input array to generate an array of convolved values. Writing circuitry operatively coupled to the first block of memory cells can store the array of convolved values in the first block.

The input array and the filter array can include digital values, and the convolution circuitry can receive the digital values as inputs to the function. For a set of frames of cells in the input array stored in the fifth block of memory cells, the function convolves the filter array with each frame in the set of frames to generate the array of convolved values, where each value in the array of convolved values corresponds to a frame in the set of frames, and indicates a number of digital values from its corresponding frame that matches corresponding digital values from the filter array. The device includes address generation circuits that apply addresses for the set of frames in the input array and the filter array to the fifth block and the fourth block in coordination with the in-place convolution.

The writing circuitry operatively coupled to the third block can be configured to store an analog level in each cell of the third block for the array of output values. The writing circuitry can apply a sequence of write pulses for each cell in the third block having a number of write pulses determined according to a corresponding output value in the array of output values. The writing circuitry can apply a sequence of write pulses for each cell in the third block having a pulse duration determined according to a corresponding output value in the array of output values. The writing circuitry can apply a sequence of write pulses for each cell in the third block having a tail length of a write pulse determined according to a corresponding output value in the array of output values.

In one embodiment, the first block of memory cells, the second block of memory cells, and the third block of memory cells can be implemented on a single integrated circuit chip or a multichip module under one package.

A method is provided for operating a device that comprises a first block of memory cells, a second block of memory cells to store a feature array, and a third block of memory cells to store an array of output values. The method comprises comparing electrical differences between memory cells in the first block and the memory cells in the second block to generate the array of output values, and storing the array of output values in the third block of memory cells.

For a set of frames of cells in the first block, the method includes comparing electrical differences between the feature array with each frame in the set of frames to generate the array of output values, where each value in the array of output values corresponds to a frame in the set of frames, and indicates electrical differences between analog values from its corresponding frame and analog values from the feature array. The method includes applying addresses for the set of frames and the feature array to the first block and the second block in coordination with the sensing circuitry comparing the electrical differences.

The method can include storing an input array in the first block of memory cells.

The device can comprise a fourth block of memory cells to store a filter array and a fifth block of memory cells to store an input array, and the method can include executing in-place convolution of a function of the filter array over the input array to generate an array of convolved values, and storing the array of convolved values in the first block. The input array and the filter array can include digital values, and the method can include receiving the digital values as inputs to the function.

For a set of frames of cells in the input array, the method can include convolving the filter array with each frame in the set of frames to generate the array of convolved values, where each value in the array of convolved values corresponds to a frame in the set of frames, and indicates a number of digital values from its corresponding frame that matches corresponding digital values from the filter array. The method can include applying addresses for the set of frames in the input array and the filter array to the fifth block and the fourth block in coordination with the in-place convolution.

The method can include storing an analog level in each cell of the third block for the array of output values. A sequence of write pulses can be applied for each cell in the third block having a number of write pulses determined according to a corresponding output value in the array of output values. A sequence of write pulses can be applied for each cell in the third block having a pulse duration determined according to a corresponding output value in the array of output values. A sequence of write pulses can be applied for each cell in the third block having a tail length of a write pulse determined according to a corresponding output value in the array of output values.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
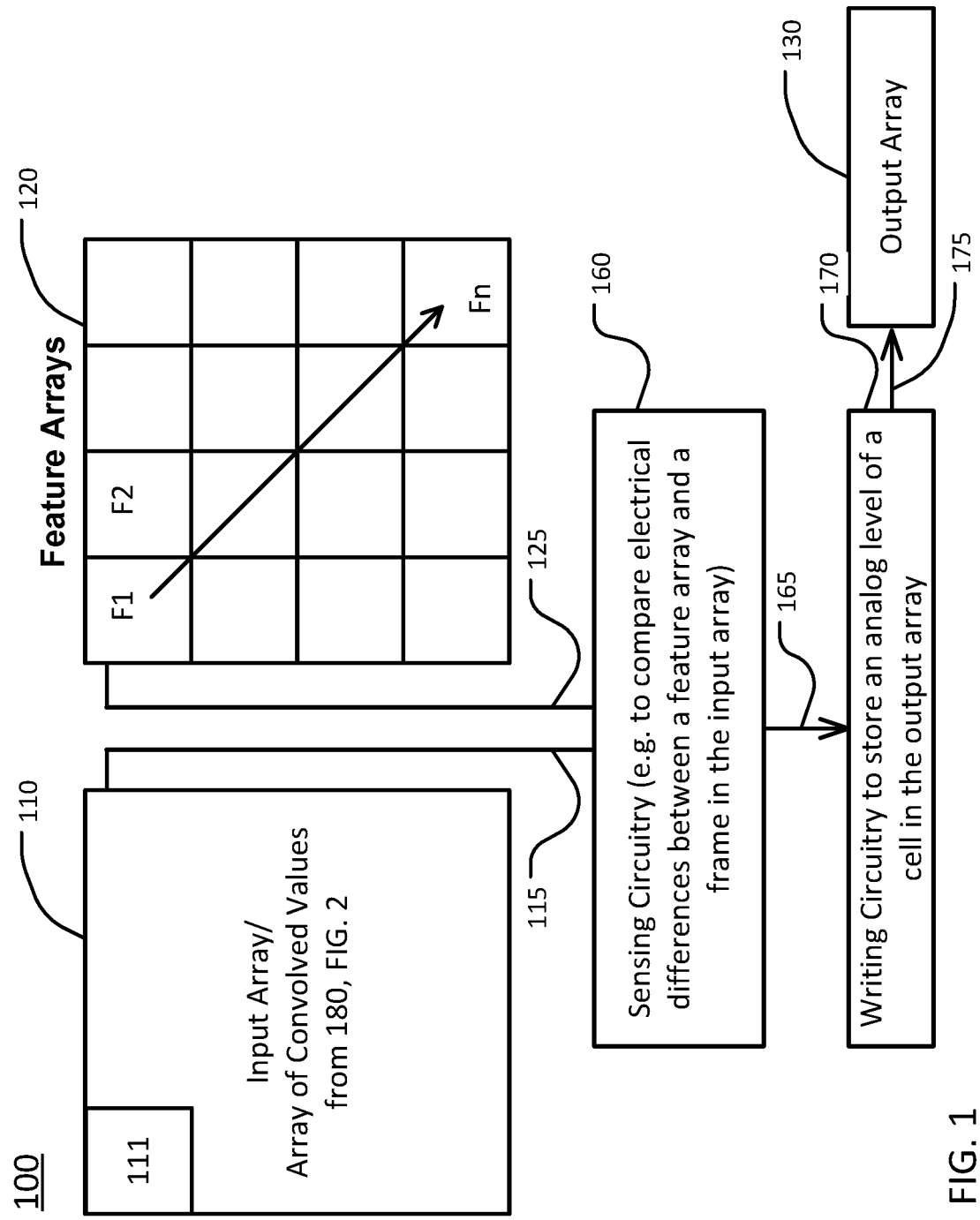
FIG. 1 illustrates an example device for comparing electrical differences between a feature array and a frame in an input array.
Figure 2:
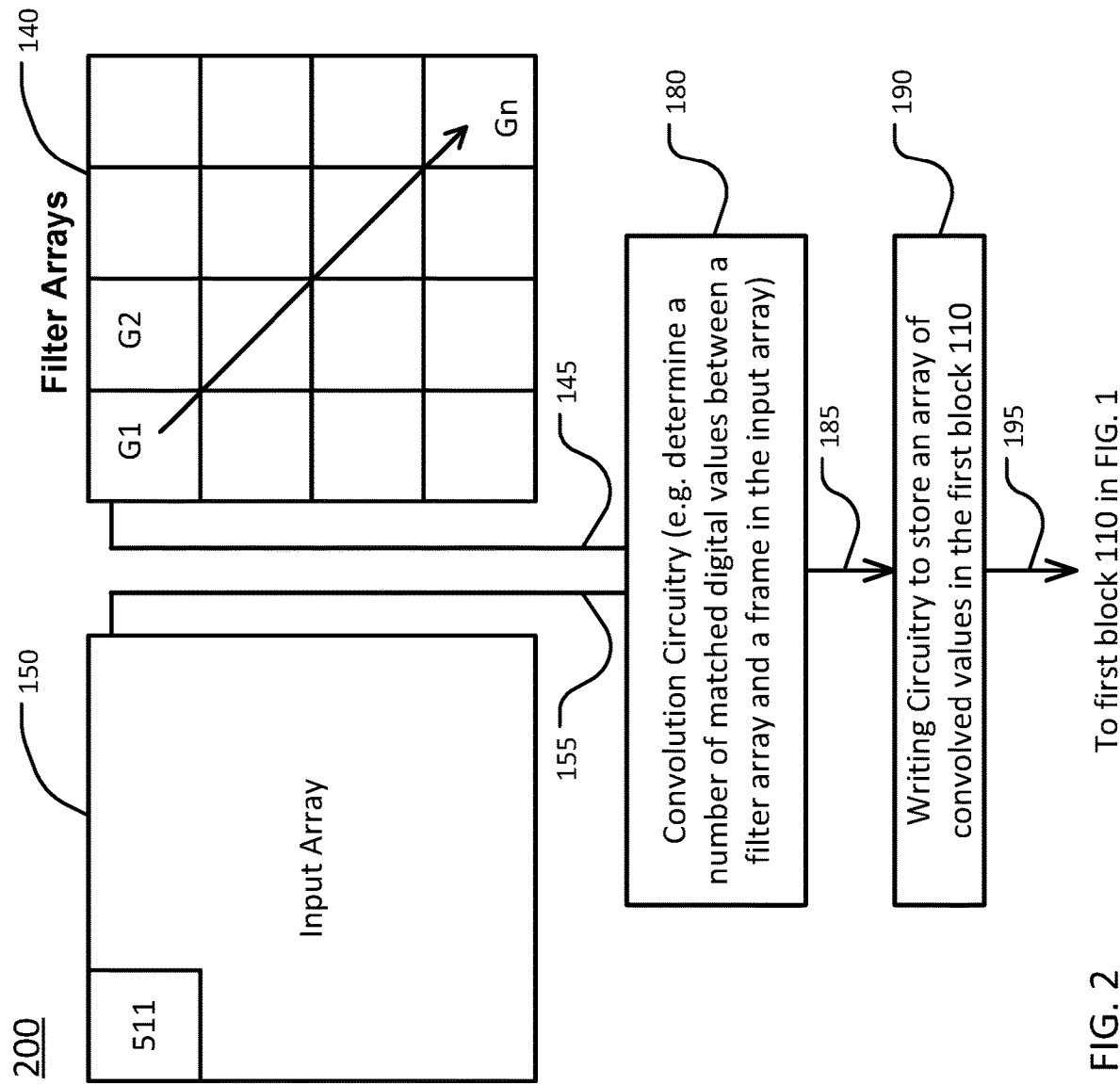
FIG. 2 illustrates an example device for executing in-place convolution of a function of a filter array over an input array.

FIG. 1 illustrates an example device for comparing electrical differences between a feature array and a frame in an input array. Device 100 comprises a first block of memory cells 110, a second block of memory cells to store a feature array 120, and a third block of memory cells 130 to store an array of output values. The first block of memory cells 110 can store an input array, such as supplied via the data-in line 1295 from input ports on the integrated circuit 1200 (FIG. 12), or an array of convolved values from in-place convolution executed by the convolution circuitry 180 (FIG. 2). Sensing circuitry 160 is coupled to the first block of memory cells 110 and the second block of memory cells 120 to compare electrical differences between the memory cells in the first block and the memory cells in the second block to generate the array of output values. The electrical differences indicate write strength for the memory cells in the array of output values. The write strength can be referred to as weight, and the array of output values can be referred as a weight array.

Writing circuitry 170 is operatively coupled to the third block of memory cells 130 to store the array of output values in the third block of memory cells 130. The writing circuitry operatively coupled to the third block is configured to store an analog level in each cell of the third block for the array of output values, for instance, according to the electrical differences between analog values from its corresponding frame and analog values from the feature array stored in the second block of memory cells 120.

Sensing circuitry 160 is coupled to the first block of memory cells 110 and the second block of memory cells 120 via lines 115 and 125 respectively. Writing circuitry 170 is coupled to the sensing circuitry 160 and the third block of memory cells 130 via lines 165 and 175 respectively.

The first block of memory cells 110 can have a number M of rows of cells and a number N of rows of cells. For instance, M and N can be 128. A plurality of feature arrays can be stored in the second block of memory cells 120. For instance, the second block of memory cells 120 can store feature arrays F1-Fn. A feature array (e.g. F1) can be stored in a number Y of rows of cells and a number X of columns of cells.

For a set of frames of cells in the input array stored in the first block of memory cells 110, the sensing circuitry 160 is configured to compare electrical differences between the feature array with each frame (e.g. 111, FIG. 1) in the set of frames to generate the array of output values, where each value in the array of output values corresponds to a frame in the set of frames, and indicates electrical differences between analog values from its corresponding frame and analog values from the feature array. The device can includes address generation circuits (1250, FIG. 12) that apply addresses for the set of frames and the feature array to the first block and the second block in coordination with the sensing circuitry comparing the electrical differences.

Writing circuitry 170 operatively coupled to the third block is configured to store an analog level in each cell of the third block for the array of output values. Writing circuitry 170 can apply a sequence of write pulses for each cell in the third block having a number of write pulses determined according to a corresponding output value in the array of output values, where the analog levels in the third block of memory cells can include resistance levels or threshold voltage levels. For instance, a difference in analog levels can be compared against a resistance difference threshold, and a number of write pulses for changing the resistance levels can be based on whether the difference is above or below the resistance difference threshold. For instance, a difference in analog levels can be compared against a set of resistance difference thresholds (e.g. 0-1 MΩ), and a number of write pulses for changing the resistance levels can be based on whether the difference is lower than the lowest resistance difference threshold in the set, higher than the highest resistance difference threshold in the set, or between two resistance difference thresholds in the set. For instance, a greater difference in analog levels can correspond to a greater number of write pulses, or vice versa.

Writing circuitry 170 can apply a sequence of write pulses for each cell in the third block having a pulse duration determined according to a corresponding output value in the array of output values, where the analog levels in the third block of memory cells can include resistance levels or threshold voltage levels. For instance, a difference in analog levels can be compared against a set of resistance difference thresholds (e.g. 0-1 MΩ), and a pulse duration for changing the resistance levels or threshold voltage levels can be based on whether the difference is lower than the lowest resistance difference threshold in the set, higher than the highest resistance difference threshold in the set, or between two resistance difference thresholds in the set. The pulse duration of a write pulse can be applied to a sequence of write pulses so the write pulses in the sequence have the same pulse duration. For instance, a greater difference in analog levels can correspond to a longer pulse duration of a write pulse, or vice versa.

Writing circuitry 170 can apply a sequence of write pulses for each cell in the third block having a tail length of a write pulse determined according to a corresponding output value in the array of output values, where the analog levels in the third block of memory cells can include resistance levels. For instance, a difference in analog levels can be compared against a set of resistance difference thresholds (e.g. 0-1 MΩ), and a tail length of a write pulse for changing the resistance levels can be based on whether the difference is lower than the lowest resistance difference threshold in the set, higher than the highest resistance difference threshold in the set, or between two resistance difference thresholds in the set. The tail length of a write pulse can be applied to a sequence of write pulses so the write pulses in the sequence have the same tail length. For instance, a greater difference in analog levels can correspond to a longer tail length of a write pulse, or vice versa.

FIG. 2 illustrates an example device 200 for executing in-place convolution of a function of a filter array over an input array. Device 200 comprises a fourth block of memory cells 140 to store a filter array, and a fifth block of memory cells 150 to store an input array. Convolution circuitry 180 is operatively coupled to the fourth block of memory cells and the fifth block of memory cells to execute in-place convolution of a function of the filter array over the input array to generate an array of convolved values. Writing circuitry 190 is operatively coupled to the first block of memory cells 110 (FIG. 1) to store the array of convolved values in the first block. Convolution circuitry 180 is coupled to the fourth block 140 and the fifth block 150 via lines 145 and 155, respectively. Writing circuitry 190 is coupled to the convolution circuitry 180 via lines 185, and coupled to the first block of memory cells 110 (FIG. 1) via lines 195. In one embodiment, writing circuitry 170 (FIG. 1) and writing circuitry 190 can be the same writing circuitry.

The input array stored in the fifth block 150 and the filter array can include digital values, and the convolution circuitry can receive the digital values as inputs to the function. For a set of frames of cells in the input array, the function can convolve the filter array with each frame in the set of frames to generate the array of convolved values, where each value in the array of convolved values can correspond to a frame in the set of frames, and can indicate a number of digital values from its corresponding frame that matches corresponding digital values from the filter array.

Address generation circuits (1250, FIG. 12) an apply addresses for the set of frames in the input array and the filter array to the fifth block and the fourth block in coordination with the in-place convolution.

The fifth block of memory cells 150 has a number M of rows of cells and a number N of rows of cells. For instance, M and N can be 128. A plurality of filter arrays can be stored in the fourth block of memory cells 140. For instance, the fourth block of memory cells 140 can store filter arrays G1-Gn. A filter array (e.g. G1) can be stored in a number Y of rows of cells and a number X of columns of cells.

A frame of cells can have the same number Y of rows of cells and the same number X of columns of cells as in a filter array. In-place convolution of a different function of the filter array G1 can be executed over a set of frames of cells in the input array stored in the fifth block of memory cells 150. In-place convolution of a function of a different filter array (e.g. G2) can be executed over a set of frames of cells in the input array. A convolution layer can be generated by executing in-place convolution of a function of each filter array (e.g. G1) in the plurality of filter arrays (e.g. G1-Gn) over each frame of cells (511) in the set of frames in the input array.

For instance, convolution circuitry 180 can determine a number of matched digital values between cells in the filter array G1 and corresponding cells in a particular frame of cells 511 in the input array to generate an array of convolved values. Convolution circuitry 180 can determine a number of matched digital values in series, i.e., digital values of a cell in the filter array G1 and a corresponding cell in the frame of cells 511 are compared by convolution circuitry 180 at a time. Alternatively a number of matched digital values can be determined in parallel, i.e., digital values of all cells in the frame of cells 511 in the input array 150 and all corresponding cells in the filter array G1 can be compared by convolution circuitry 180 in parallel. Convolution operations are further described in reference to FIGS. 3-7.

The writing circuitry 190 operatively coupled to the first block 110 (FIG. 1) is configured to store an analog level in each cell of the first block for the array of convolved values, for instance, according to the determined number of matched digital values between the filter array and the frame of cells in the input array stored in the fifth block of memory cells 150.

Writing circuitry 190 can apply a sequence of write pulses for each cell in the first block 110 having a number of write pulses determined according to a corresponding value in the array of convolved values, where the analog levels in the first block of memory cells can include resistance levels or threshold voltage levels. For instance, a corresponding convolved value can indicate a number of matched digital values, and a number of write pulses can be greater for a higher number of matched digital values than for a lower number of matched digital values, or vice versa.

Writing circuitry 190 can apply a sequence of write pulses for each cell in the first block 110 having a pulse duration determined according to a corresponding value in the array of convolved values, where the analog levels in the first block of memory cells can include resistance levels or threshold voltage levels. For instance, a corresponding convolved value can indicate a number of matched digital values, and a pulse duration can be longer for a lower number of matched digital values than for a higher number of matched digital values, or vice versa.

Writing circuitry 190 can apply a sequence of write pulses for each cell in the first block having a tail length of a write pulse determined according to a corresponding value in the array of convolved values, where the analog levels in the first block of memory cells can include resistance levels. For instance, a corresponding convolved value can indicate a number of matched digital values, and a tail length of a write pulse can be longer for a lower number of matched digital values than for a higher number of matched digital values, or vice versa.

Figure 3:
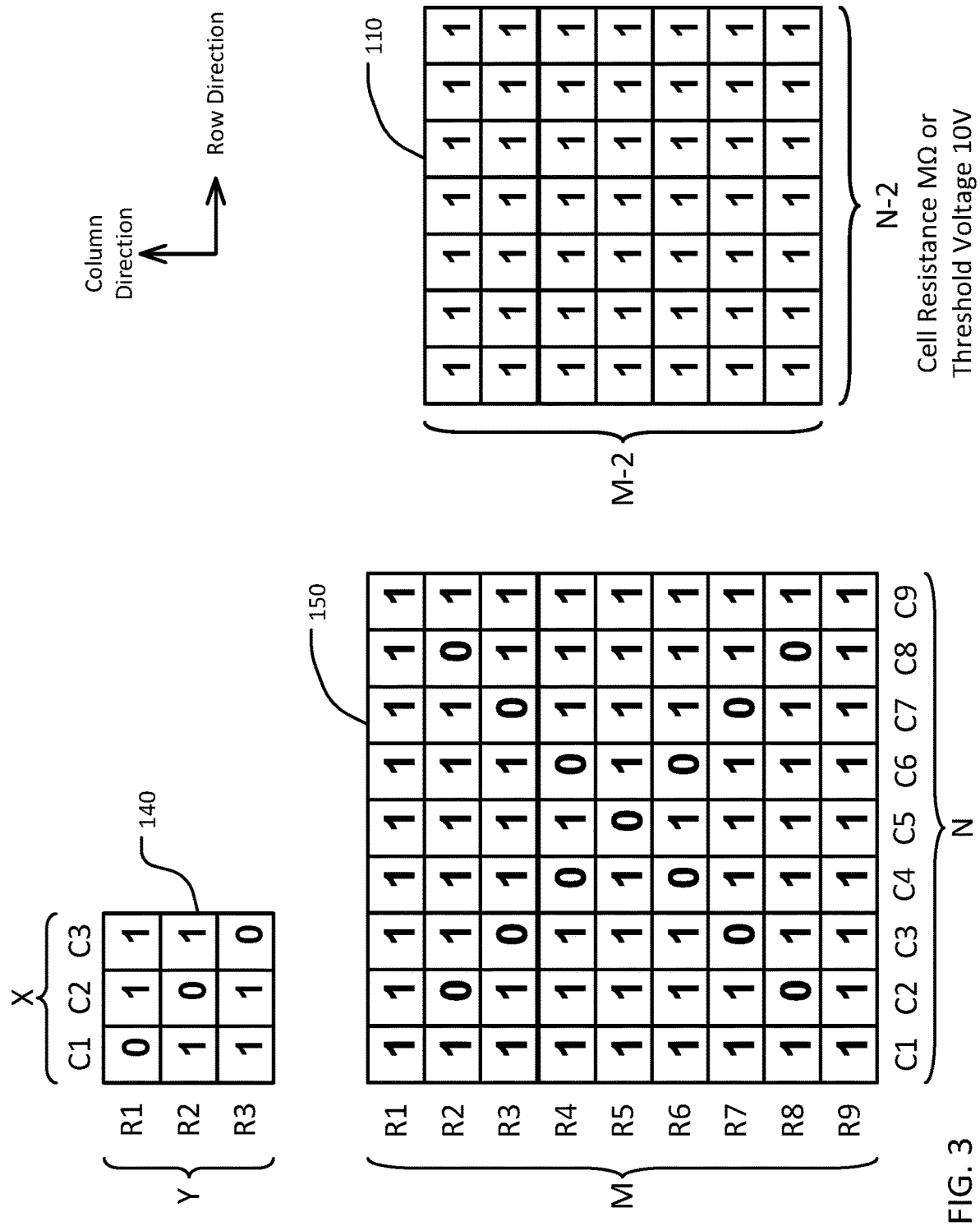
FIG. 3 illustrates executing in-place convolution as shown in FIG. 2 in more details.

FIG. 3 illustrates executing in-place convolution as shown in FIG. 2 in more details. As described in reference to FIG. 2, convolution circuitry 180 can execute in-place convolution of a function of the filter array stored in the fourth block 140 over the input array stored in the fifth block of memory cells 150 to generate an array of convolved values. Writing circuitry (190, FIG. 2) operatively coupled to the first block of memory cells 110 can store the array of convolved values from convolution circuitry 180 in the first block of memory cells 110. In one embodiment, the first block of memory cells 110, the fourth block of memory cells 140, and the fifth block of memory cells 150 can be implemented on a single integrated circuit chip or a multichip module under one package.

As shown in the example of FIG. 3, the fifth block of memory cells 150 to store the input array can have a number M of rows of cells and a number N of columns of cells. A number '1' or '0' shown for a cell in the fifth block of memory cells represents a digital value. The fourth block of memory cells 140 to store the filter array can have a number Y of rows of cells and a number X of columns of cells. A number '1' or '0' shown for a cell in the fourth block of memory cells represents a digital value.

In one embodiment, the first block of memory cells 110 can have a number (M−Y+1) of rows of cells and a number (N−X+1) of columns of cells. As shown in the examples of FIGS. 3-7, N=9, M=9, X=3, and Y=3. The fifth block of memory cells 150 has 9 rows (R1-R9) and 9 columns (C1-C9), the fourth block of memory cells 140 has 3 rows (R1, R2, R3) and 3 columns (C1, C2, C3), and the first block of memory cells 110 has 7 rows and 7 columns. A frame of cells in the fifth block of memory cells to store the input array can have the same number Y of rows and the same number X of columns as the fourth block of memory cells 140.

As used herein, a target cell in a frame of cells in the fifth block of memory cells is a cell at the center of the frame of cells, surrounded by at least one row of cells on an upper side, at least one row of cells on a lower side, at least one row of cells on a left side, and at least one row of cells on a right side of the target cell. For instance, the frame of cells can include cells in 3 consecutive rows (e.g. R1, R2, R3) and 3 consecutive columns (e.g. C1, C2, C3), and the target cell is at a center row and a center column of the frame of cells (e.g. R2C2 for a frame 511, FIG. 4).

In the embodiment described above in reference to FIG. 3, cells in the border rows (e.g. R1, R9) and in the border columns (e.g. C1, C9) are not target cells, as they are not surrounded by other cells on at least one of top, bottom, left and right sides. Accordingly a number of frames of cells in the input array that can have a target cell at the center of a frame is fewer than the number of cells in the input array, the number of convolutions of a function of the filter array over the frames of cells having a target cell is fewer than the number of cells in the input array, and the number of cells in the first block of memory cells to store the array of convolved values from the convolutions is fewer than the number of cells in the input array.

In an alternative embodiment, zero-padding can be used to pad the fifth block of memory cells 150 with a binary value '0' around the fifth block of memory cells. For instance, a row of cells with binary values '0' can be padded adjacent a border row (e.g. R1, R9) in the fifth block of memory cells, and a column of cells of '0' can be padded adjacent a border column (e.g. C1, C9) in the fifth block of memory cells, so the filter array can be applied to cells in a border row or a border column in the fifth block of memory cells. In other words, with padded rows of cells and padded columns of cells, each cell in a border row of cells or a border column of cells can be a target cell in a frame of cells for in-place convolution with a filter array. With padded rows of cells and padded columns of cells for the fifth block of memory cells, the first block of memory cells can have the same number M of rows of cells and the same number N of columns as the fifth block of memory cells.

In one embodiment, the analog levels in the first block of memory cells 110 include programmable resistance memory cells having resistance levels. Programmable resistance memories can include phase change memory (PCM), resistive random access memory (RRAM), and magnetoresistive random access memory (MRAM). In one embodiment, the analog levels in the first block of memory cells can include at least a number (X times Y) of resistance levels. In this example, X=3, Y=3, and (X times Y)=9 resistance levels. In this embodiment, a number '1', '0.9', '0.8', '0.7', '0.6', etc for a cell in the first block of memory cells can represent 1 MΩ, 0.9 MΩ, 0.8 MΩ, 0.7 M≤, 0.6 MΩ, etc respectively, as shown in the examples of FIGS. 3-7.

Before a process starts to convolve a function of the filter array over the input array to generate an array of convolved values, the first block of memory cells can be set to the highest resistance level, such as 1 MΩ, representing the case when a number of matched digital values is the same as the number of digital values in a filter array.

In an alternative embodiment, the analog levels in the first block of memory cells 110 include charge storage memory cells having threshold voltage levels. Charge storage memories can include floating gate and nitride trapping memories. In one embodiment, the analog levels in the first block of memory cells can include at least a number (X times Y) of threshold voltage levels. In this example, X=3, Y=3, and (X times Y)=9 threshold voltage levels. In this embodiment, a number '1', '0.9', '0.8', '0.7', '0.6', for a cell in the first block of memory cells can represent 10V, 9V, 8V, 7V, 0.6V, etc respectively, as shown in the examples of FIGS. 3-7.

Before a process starts to convolve a function of the filter array over the input array to generate an array of convolved values, the first block of memory cells can be erased to the lowest threshold voltage level, representing the case when a number of matched digital values is zero.

Convolution circuitry (180, FIG. 2) can execute in-place convolution of a function of the filter array over the input array to generate an array of convolved values. Each value in the array of convolved values can indicate a number of digital values from its corresponding frame that match corresponding digital values from the filter array.

Storing the convolved value in the particular cell in the first block of memory cells can include addressing the particular cell in the first block of memory cells, and converting the convolved values from in-place convolution into a set time of a set pulse or a program time of a program pulse for the cell in the first block of memory cells. A set time of a set pulse can be used when analog levels in the first block of memory cells include resistance levels. A program time of a program pulse can be used when analog levels in the first block of memory cells include threshold voltage levels. The set time can be applied to a sequence of set pulses so the set pulses in the sequence have the same set time. The program time can be applied to a sequence of program pulses so the program pulses in the sequence have the same program time. The convolved values can be converted into a number of set pulses for a sequence of set pulses, or a number of program pulses for a sequence of program pulses. Furthermore, the convolved values can be converted into a combination of varying set times and numbers of set pulses, or a combination of varying program times and numbers of program pulses. The convolved values in the array of convolved values are stored as analog levels in the first block of memory cells, and no verify cycles are needed to verify that a cell in the first block of memory cells has been changed to a target resistance or threshold range. In comparison, to write a digital value to a cell, verify cycles are needed to verify whether the cell is within a target resistance or threshold range, and to determine whether more set pulses or program pulses are needed. Storing convolved values as analog levels instead of digital values can improve the performance of storing the convolved values in the array of convolved values, because the verify cycles are not needed.

The frame address of a frame of cells in the fifth block of memory cells 150 can refer to a row address and a column address of a cell in the frame of cells. For instance, a frame address can refer to a row address and a column address of a target cell at the center of a frame of cells (e.g. R2C2 for a frame 511, FIG. 4). The frame address can be sequenced in a row direction from a particular frame of cells by at least one column, or in a column direction from a particular frame of cells by at least one row, to address a next frame of cells. Technology as described herein for executing in-place convolution of the function of the filter array over a frame of cells in the fifth block of memory cells can be applied in sequence to other frames of cells in the fifth block of memory cells.

Figure 4:
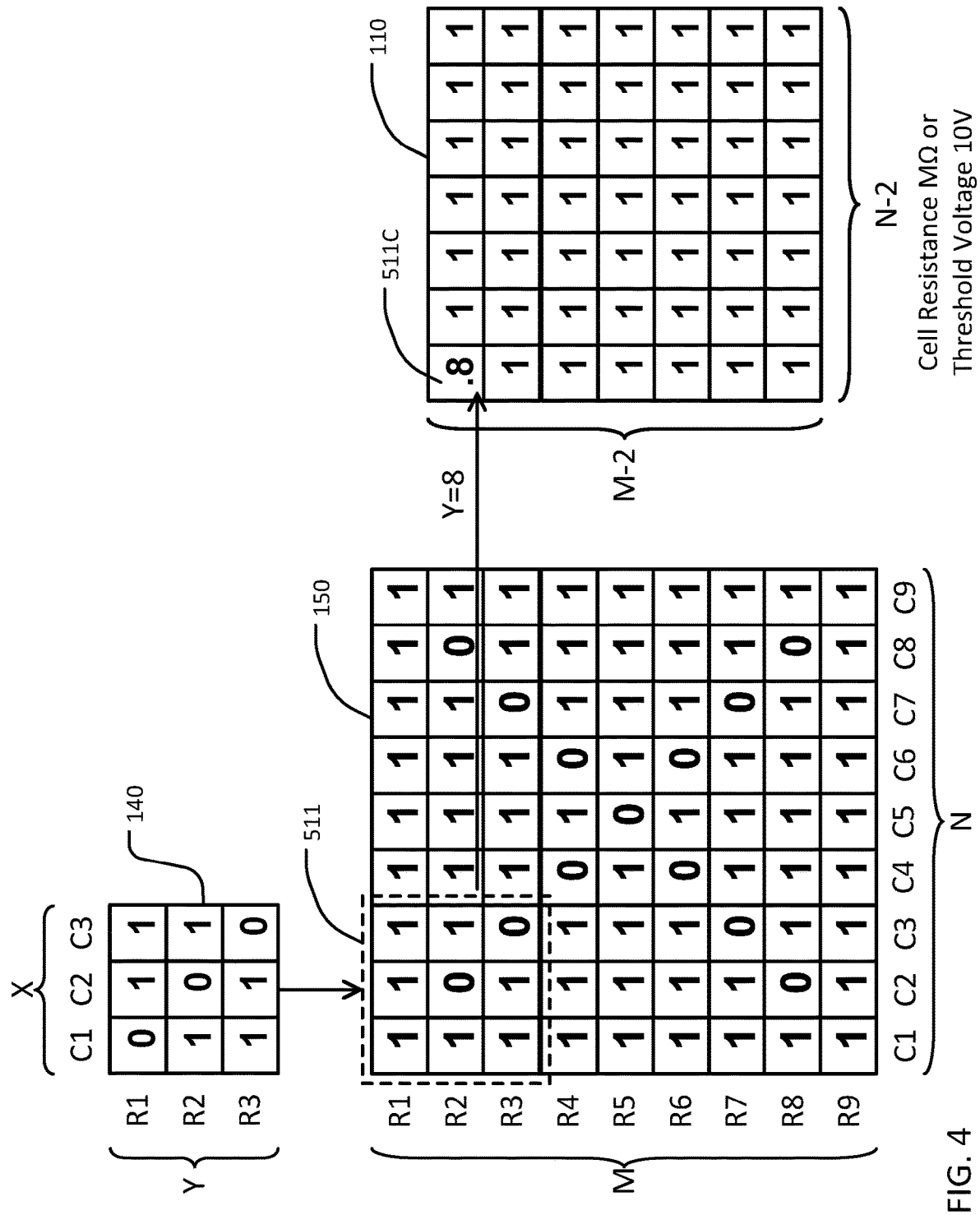
FIG. 4 illustrates an example of executing in-place convolution of a function of a filter array over an input array.

FIG. 4 illustrates an example of executing in-place convolution of a function of a filter array over an input array. In this example, a number of matched digital values is between the fourth block of memory cells 140 to store the filter array and a particular frame of cells 511 at a first frame address R2C2 in the fifth block of memory cells 150. Convolution circuitry (180, FIG. 2) can compare the filter array stored in the fourth block of memory cells 140 and the particular frame of cells 511 stored in the fifth block of memory cells 150. A convolved value from the convolution circuitry can indicate a number of digital values (Y=8) from its corresponding frame (511) that matches corresponding digital values from the filter array.

In this example, the fourth block of memory cells 140 to store the filter array has 3 rows (R1, R2, R3) and 3 columns (C1, C2, C3) of cells, and the particular frame of cells 511 has 3 rows (R1, R2, R3) and 3 columns (C1, C2, C3) of cells correspondingly. In this example, the cells in the filter array and the particular frame have one bit per cell. The filter array has digital values 0, 1, 1, 1, 0, 1, 1, 1 and 0 at addresses R1C1, R1C2, R1C3, R2C1, R2C2, R2C3, R3C1, R3C2 and R3C3, respectively. The particular frame of cells has digital values 1, 1, 1, 1, 0, 1, 1, 1 and 0 at corresponding addresses. Table 1 indicates matched digital values with '1', and digital values that are not matched with '0'. In this example, the number of matched digital values is 8 (Y=8).

TABLE 1

|  | R1C1 | R1C2 | R1C3 | R2C1 | R2C2 | R2C3 | R3C1 | R3C2 | R3C3 |
|---|---|---|---|---|---|---|---|---|---|
| Kernel | 0 | 1 | 1 | 1 | 0 | 1 | 1 | 1 | 0 |
| Frame | 1 | 1 | 1 | 1 | 0 | 1 | 1 | 1 | 0 |
| Matched | 0 | 1 | 1 | 1 | 1 | 1 | 1 | 1 | 1 |

The fourth block of memory cells can store different values than shown in this example. The function can be different than determining a number of matched digital values. For example, the function can including determining a number of corresponding digital values in the filter array and the particular frame of cells that are both '1', both '0', not matched, etc.

Writing circuitry (190, FIG. 2) operatively coupled to the first block of memory cells 110 can change an analog level of a first cell 511C in the first block of memory cells 110 according to the number of matched digital values. In one embodiment, the analog levels in the first block of memory cells include resistance levels, and a resistance level can be set to the number of matched digital values divided by (1+the number of cells in the fourth block of memory cells) in MΩ (Megaohm). In this example, where the number of matched digital values is 8 and the second array has 9 cells, a resistance level of 8/(1+9)=0.8 MΩ can be set for a first cell 511C in the first block of memory cells 110.

Figure 5:
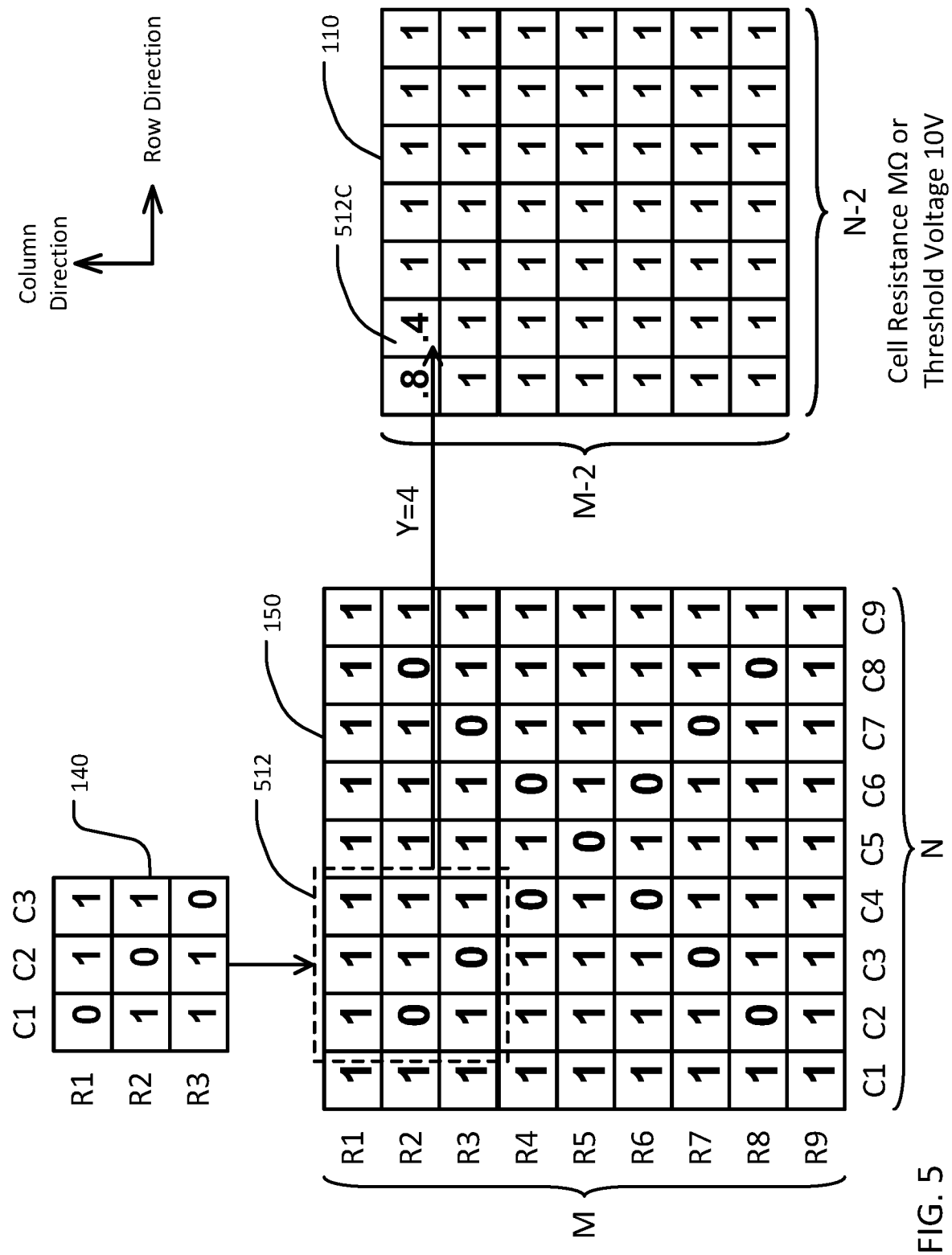
FIG. 5 illustrates a second example of executing in-place convolution of a function of a filter array over an input array.

FIG. 5 illustrates a second example of executing in-place convolution of a function of a filter array over an input array. Address generation circuits (1250, FIG. 12) can apply addresses for the set of frames and the filter array to the fifth block of memory cells and the fourth block of memory cells in coordination with the in-place convolution. A second frame of cells 512 can be selected at a second frame address in the fifth block of memory cells. The second frame address can be sequenced from the first frame address by a stride, where the stride can include either at least one column in a row direction or at least one row in a column direction. In this example, the second frame of cells 512 at the second frame address R2C3 in the fifth block of memory cells 150 is selected, where the second frame address R2C3 is the address of the target cell at the center of the second frame of cells. A second number of matched digital values is between the fourth block of memory cells 140 to store the filter array and the second frame of cells 512 at the second frame address R2C3 in the fifth block of memory cells 150. The second frame address R2C3 can be sequenced from the first frame address R2C2 by one column in a row direction. Convolution circuitry (180, FIG. 2) can compare the filter array stored in the fourth block of memory cells 140 and the second frame of cells 512 stored in the fifth block of memory cells 150. A convolved value from the convolution circuitry can indicate a number of digital values (Y=4) from its corresponding frame (512) that matches corresponding digital values from the filter array.

In this example, the fourth block of memory cells 140 to store the filter array has 3 rows (R1, R2, R3) and 3 columns (C1, C2, C3), and the second frame of cells 512 has 3 rows (R1, R2, R3) and 3 columns (C2, C3, C4) correspondingly. In this example, the cells in the filter array and the second frame have one bit per cell. The filter array has digital values 0, 1, 1, 1, 0, 1, 1, 1 and 0 at addresses R1C1, R1C2, R1C3, R2C1, R2C2, R2C3, R3C1, R3C2 and R3C3, respectively. The second frame of cells has digital values 1, 1, 1, 0, 1, 1, 1, 0 and 1 at corresponding addresses. Table 2 indicates matched digital values with '1', and digital values that are not matched with '0'. In this example, the number of matched digital values is 4 (Y=4).

TABLE 2

|  | R1C1 | R1C2 | R1C3 | R2C1 | R2C2 | R2C3 | R3C1 | R3C2 | R3C3 |
|---|---|---|---|---|---|---|---|---|---|
| Kernel | 0 | 1 | 1 | 1 | 0 | 1 | 1 | 1 | 0 |
| Frame | 1 | 1 | 1 | 0 | 1 | 1 | 1 | 0 | 1 |
| Matched | 0 | 1 | 1 | 0 | 0 | 1 | 1 | 0 | 0 |

Writing circuitry (190, FIG. 2) operatively coupled to the first block of memory cells 110 can change an analog level of a second cell 512C in the first block of memory cells 110 according to the second number of matched digital values. In one embodiment, the analog levels in the first block of memory cells include resistance levels, and a resistance level can be set to the number of matched digital values divided by (1+the number of cells in the fourth block of memory cells) in Megaohm (MΩ). In this example, where the number of matched digital values is 4 and the second array has 9 cells, a resistance level of 4/(1+9)=0.4 MΩ can be set for a second cell 512C in the first block of memory cells 110.

The second cell 512C is at a different row/column address than the first cell 511C in the first block of memory cells 110. For instance, the second cell 512C can be at the same row of cells as the first cell 511C in the first block of memory cells 110, and at a different column of cells as the first cell 511C in the first block of memory cells 110. For instance, the second cell 512C can be at a different row of cells and at a different column of cells as the first cell 511C in the first block of memory cells 110.

Figure 6:
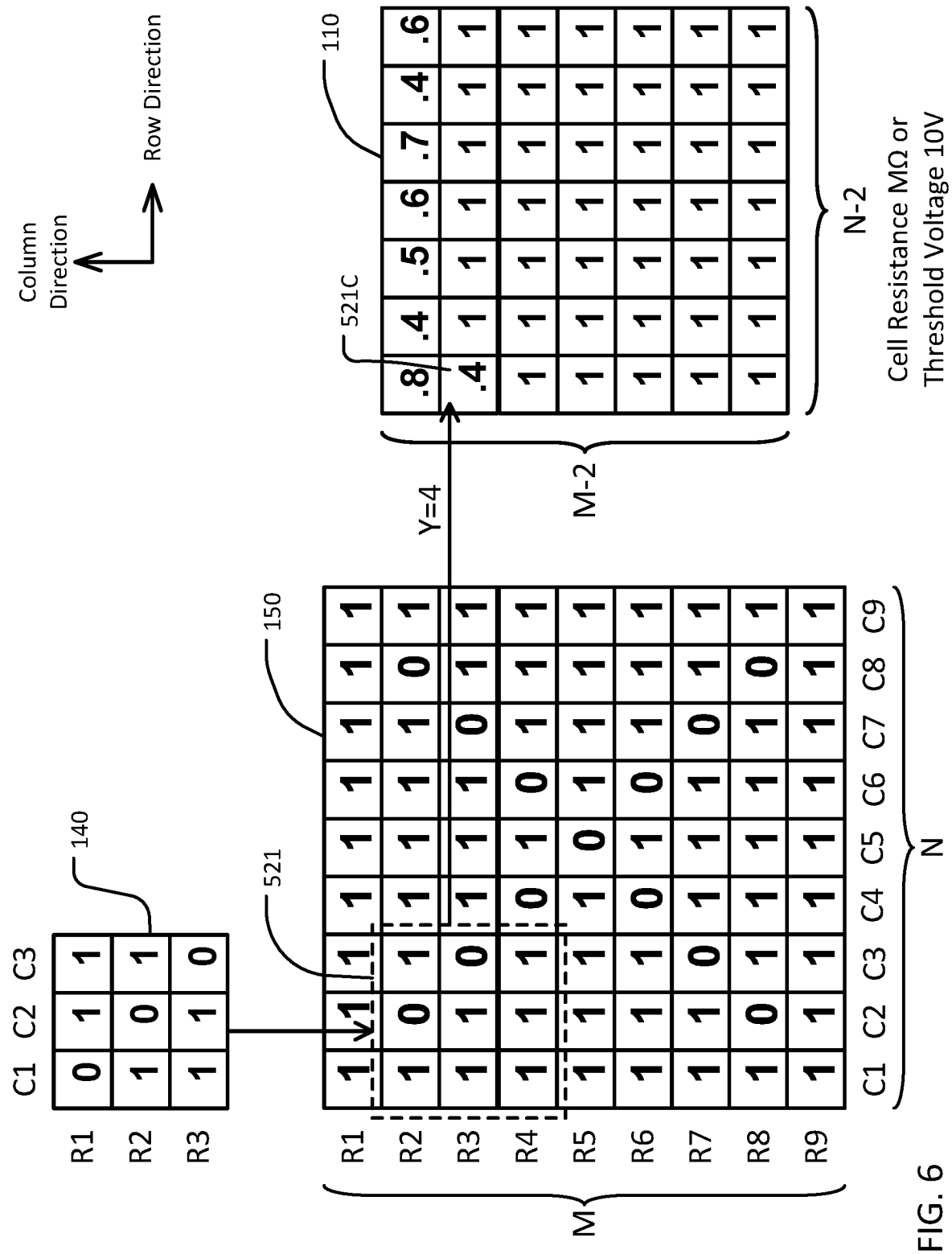
FIG. 6 illustrates a third example of executing in-place convolution of a function of a filter array over an input array.

FIG. 6 illustrates a third example of executing in-place convolution of a function of a filter array over an input array. Address generation circuits (1250, FIG. 12) can apply addresses for the set of frames and the filter array to the fifth block of memory cells 150 and the fourth block of memory cells 140 in coordination with the in-place convolution. A third frame of cells 521 can be selected at a third frame address in the fifth block of memory cells. The third frame address can be sequenced from the first frame address by a stride, where the stride can include either at least one column in a row direction or at least one row in a column direction. In this example, a third frame of cells 521 at a third frame address R3C2 in the fifth block of memory cells 150 is selected, where the third frame address R3C2 is the address of the target cell at the center of the third frame of cells. A third number of matched digital values is between the fourth block of memory cells 140 to store the filter array and the third frame of cells 521 at the third frame address R3C2 in the fifth block of memory cells 110. The third frame address R3C2 can be sequenced from the first frame address R2C2 by one row in a column direction. Convolution circuitry (180, FIG. 2) can compare the filter array stored in the fourth block of memory cells 140 and the third frame of cells 521 in the fifth block of memory cells 150. A convolved value from the convolution circuitry can indicate a number of digital values (Y=4) from its corresponding frame (121) that matches corresponding digital values from the filter array.

In this example, the fourth block of memory cells 140 to store the filter array has 3 rows (R1, R2, R3) and 3 columns (C1, C2, C3), and the third frame of cells 521 has 3 rows (R2, R3, R4) and 3 columns (C1, C2, C3) correspondingly. In this example, the cells in the filter array and the third frame have one bit per cell. The filter array has digital values 0, 1, 1, 1, 0, 1, 1, 1 and 0 at addresses R1C1, R1C2, R1C3, R2C1, R2C2, R2C3, R3C1, R3C2 and R3C3, respectively. The third frame of cells has digital values 1, 0, 1, 1, 1, 0, 1, 1 and 1 at corresponding addresses. Table 3 indicates matched digital values with '1', and digital values that are not matched with '0'. In this example, the number of matched digital values is 4 (Y=4).

TABLE 3

|  | R1C1 | R1C2 | R1C3 | R2C1 | R2C2 | R2C3 | R3C1 | R3C2 | R3C3 |
|---|---|---|---|---|---|---|---|---|---|
| Kernel | 0 | 1 | 1 | 1 | 0 | 1 | 1 | 1 | 0 |
| Frame | 1 | 0 | 1 | 1 | 1 | 0 | 1 | 1 | 1 |
| Matched | 0 | 0 | 1 | 1 | 0 | 0 | 1 | 1 | 0 |

Writing circuitry (190, FIG. 2) operatively coupled to the first block of memory cells 110 can change an analog level of a third cell 521C in the first block of memory cells 110 according to the third number of matched digital values. In one embodiment, the analog levels in the first block of memory cells include resistance levels, and a resistance level can be set to the number of matched digital values divided by (1+the number of cells in the fourth block of memory cells) in Megaohm (MΩ). In this example, where the number of matched digital values is 4 and the second array has 9 cells, a resistance level of 4/(1+9)=0.4 MΩ can be set for a third cell 521C in the first block of memory cells 110.

The third cell 521C is at a different row/column address than the first cell 511C and the second cell 512C in the first block of memory cells 110. For instance, the third cell 521C can be at the same column of cells as the first cell 511C in the first block of memory cells 110, and at a different row of cells as the first cell 511C in the first block of memory cells 110. For instance, the third cell 521C can be at a different row of cells and at a different column of cells as the first cell 511C and the second cell 512C in the first block of memory cells 110.

In one embodiment, executing in-place convolution of a function of the filter array over the input array can include convolving the function of the filter array over frames of cells at a first row address (e.g. R1) in the fifth block of memory cells 150 while sequencing the column addresses (C1-C9) of the frames of cells, and then convolving the function of the filter array over frames of cells at a next row address (e.g. R2) in the fifth block of memory cells 150 while sequencing the column addresses (C1-C9) of the frames of cells. The next row address is sequenced from the first row address by at least one row.

Figure 7:
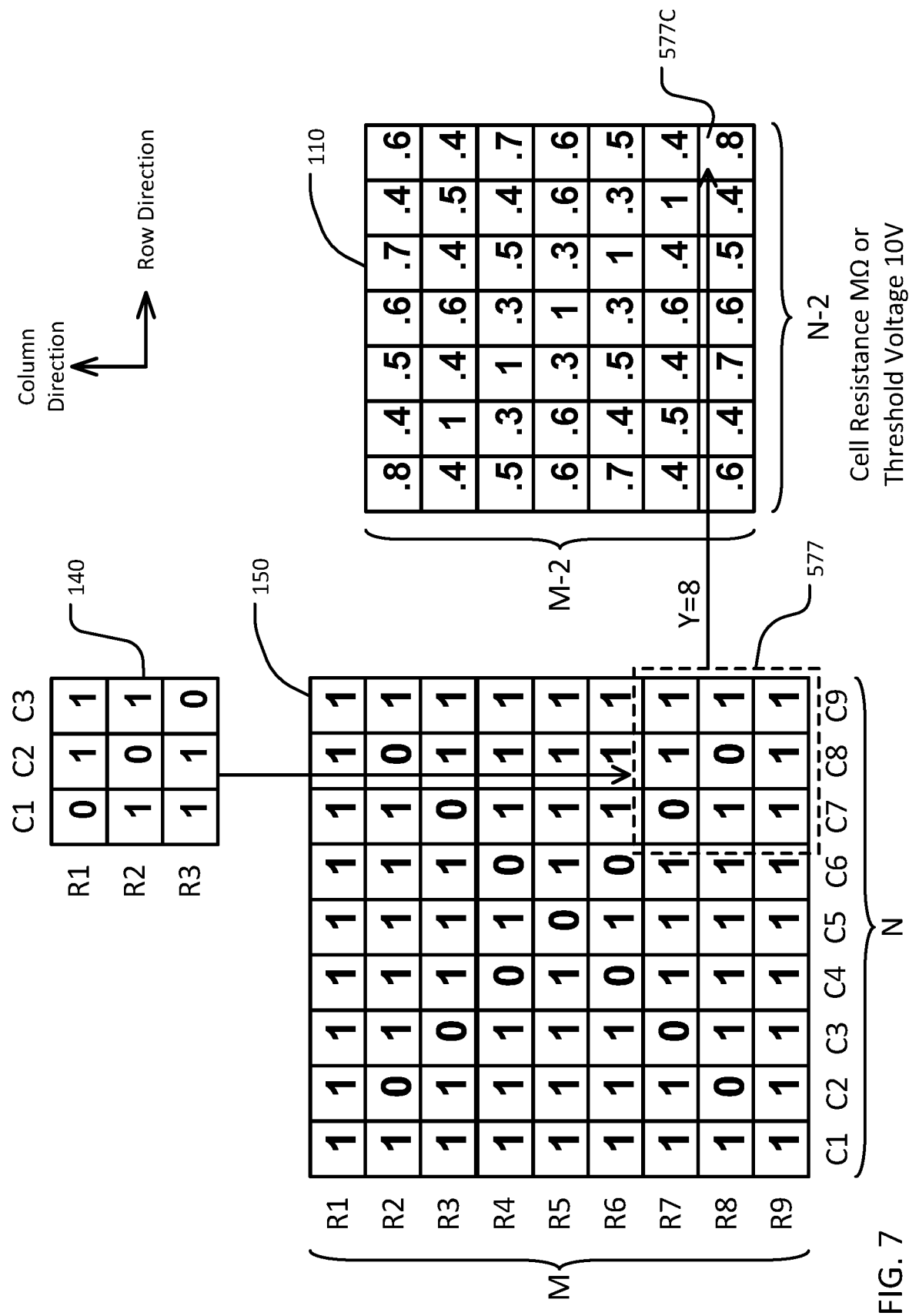
FIG. 7 illustrates a fourth example of executing in-place convolution of a function of a filter array over an input array.

FIG. 7 illustrates a fourth example of executing in-place convolution of a function of a filter array over an input array. Address generation circuits (1250, FIG. 12) can apply addresses for the set of frames and the filter array to the fifth block of memory cells 150 and the fourth block of memory cells 140 in coordination with the in-place convolution. In this example, a last number of matched digital values is between the fourth block of memory cells 140 to store the filter array and a last frame of cells 577 in the fifth block of memory cells 150. The last frame of cells 577 includes cells addressed in the last three rows of cells in the number M of rows and in the last three columns of cells in the number N of columns, e.g. R7C7, R7C8, R7C9, R8C7, R8C8, R8C9, R9C7, R9C8, R9C9. Convolution circuitry (180, FIG. 2) can compare the filter array stored in the fourth block of memory cells 140 and the last frame of cells 577 in the fifth block of memory cells 150. A convolved value from the convolution circuitry can indicate a number of digital values (Y=8) from its corresponding frame (577) that matches corresponding digital values from the filter array.

In this example, the fourth block of memory cells 140 to store the filter array has 3 rows (R1, R2, R3) and 3 columns (C1, C2, C3), and the last frame of cells 577 has 3 rows (R7, R8, R9) and 3 columns (C7, C8, C9) correspondingly. The filter array has digital values 0, 1, 1, 1, 0, 1, 1, 1 and 0 at addresses R1C1, R1C2, R1C3, R2C1, R2C2, R2C3, R3C1, R3C2 and R3C3, respectively. In this example, the cells in the filter array and the last frame have one bit per cell. The last frame of cells has digital values 0, 1, 1, 1, 0, 1, 1, 1 and 1 at corresponding addresses. Table 4 indicates matched digital values with '1', and digital values that are not matched with '0'. In this example, the number of matched digital values is 8 (Y=8).

TABLE 4

|  | R1C1 | R1C2 | R1C3 | R2C1 | R2C2 | R2C3 | R3C1 | R3C2 | R3C3 |
|---|---|---|---|---|---|---|---|---|---|
| Kernel | 0 | 1 | 1 | 1 | 0 | 1 | 1 | 1 | 0 |
| Frame | 0 | 1 | 1 | 1 | 0 | 1 | 1 | 1 | 1 |
| Matched | 1 | 1 | 1 | 1 | 1 | 1 | 1 | 1 | 0 |

Writing circuitry (190, FIG. 2) operatively coupled to the first block of memory cells 110 can change an analog level of the cell 577C in the first block of memory cells 110 according to the last number of matched digital values. In one embodiment, the analog levels in the first block of memory cells include resistance levels, and a resistance level can be set to the number of matched digital values divided by (1+the number of cells in the fourth block of memory cells) in Megaohm (MΩ). In this example, where the number of matched digital values is 8 and the second array has 9 cells, a resistance level of 8/(1+9)=0.8 MΩ can be set for the last cell 577C in the first block of memory cells 110.

Address generation circuits (1250, FIG. 12) can apply addresses for the set of frames and the filter array to the fifth block 150 and the fourth block of memory cells 140 in coordination with the in-place convolution. A first function of the filter array can be convolved over all frames in the set of frames stored in the input array to generate an array of convolved values, and the array of convolved values can be stored as analog levels in the first block of memory cells. Subsequently a second function of the filter array can be convolved over all frames in the set of frames stored in the input array to generate a second array of convolved values, and the second array of convolved values can be stored as analog levels in the first block of memory cells.

Furthermore, different functions of different filter arrays can be used for executing in-place convolution over the input array to generate respective arrays of convolved values, and the respective arrays of convolved values can be stored as analog levels in the first block of memory cells.

Figure 8:
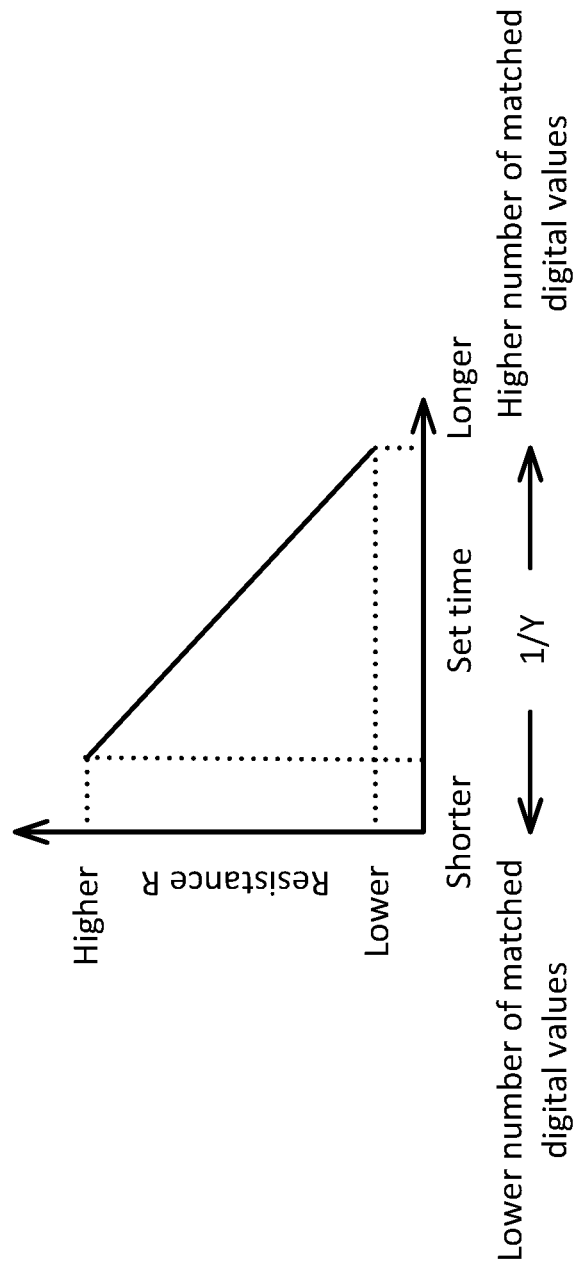
FIG. 8 illustrates an example of a pulse duration determined according to a convolved value from in-place convolution for programmable resistance memory cells.

FIG. 8 illustrates an example of a pulse duration determined according to a convolved value from in-place convolution for programmable resistance memory cells. In this example, the first block of memory cells 110 includes programmable resistance memory cells having resistance levels. Programmable resistance memories can include phase change memory (PCM), resistive random access memory (RRAM), and magnetoresistive random access memory (MRAM). For programmable resistance memory cells, a pulse duration can be referred to as a set time, and a write pulse can be referred to as a set pulse. The writing circuitry (190, FIG. 2) can determine a pulse duration for write pulses in a sequence of write pulses for changing the resistance levels of cells in the first block of memory cells according to the number of matched digital values Y between a filter array stored in the fourth block of memory cells and a particular frame of cells in the input array stored in the fifth block of memory cells. For instance, the set time of a set pulse can be longer for a lower number of matched digital values than for a higher number of matched digital values, or vice versa. A longer set time of a set pulse can induce lower resistance R, and a shorter set time of a set pulse can induce higher resistance R.

The writing circuitry (190, FIG. 2) can also determine a number of write pulses for changing the resistance levels according to the number of matched digital values. For instance, a number of write pulses can be greater for a higher number of matched digital values than for a lower number of matched digital values, or vice versa.

Before a process starts to execute in-place convolution of a function of the filter array over the input array to generate an array of convolved values, the first block of memory cells can be set to the highest resistance level, representing the case when a number of matched digital values is the same as the number of digital values in a filter array. During the process, if a number of matched digital values is the same as the number of digital values in a filter array, then no set pulse is applied to a cell in the first block of memory cells.

Figure 9:
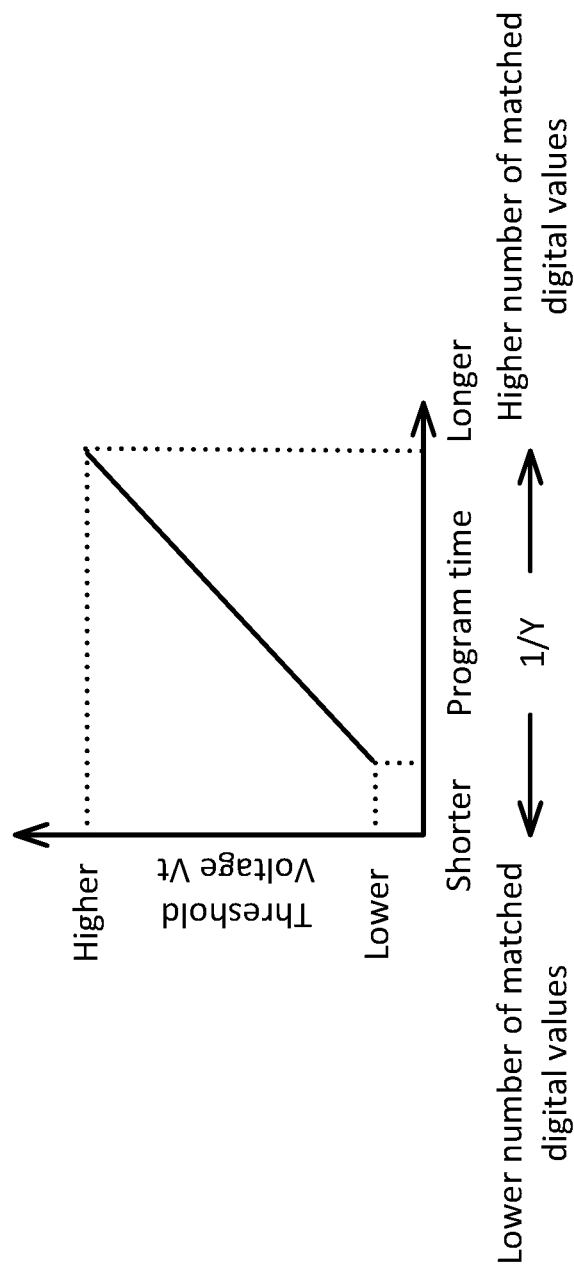
FIG. 9 illustrates an example of a pulse duration determined according to convolved value from in-place convolution for charge storage memory cells.

FIG. 9 illustrates an example of a pulse duration determined according to convolved value from in-place convolution for charge storage memory cells. In this example, the first block of memory cells 110 includes charge storage memory cells having threshold voltage levels. Charge storage memories can include floating gate and nitride trapping memories. For charge storage memory cells, a pulse duration can be referred to as a program time, and a write pulse can be referred to as a program pulse. The writing circuitry (190, FIG. 2) can determine a pulse duration for write pulses in a sequence of write pulses for changing the threshold voltage levels in the first block of memory cells according to a number of matched digital values Y between a filter array stored in the fourth block of memory cells and a particular frame of cells in the input array stored in the fifth block of memory cells. For instance, the program time of a program pulse can be longer for a lower number of matched digital values than for a higher number of matched digital values, or vice versa. A longer program time of a program pulse can induce higher threshold voltage Vt, and a shorter program time of a program pulse can induce lower resistance R.

The writing circuitry (190, FIG. 2) can also determine a number of write pulses for changing the threshold voltage levels according to the number of matched digital values. For instance, a number of program pulses can be greater for a higher number of matched digital values than for a lower number of matched digital values, or vice versa.

Before a process starts to execute in-place convolution of a function of the filter array over the input array to generate an array of output values, the first block of memory cells can be erased to the lowest threshold voltage level, representing the case when a number of matched digital values is zero. During the process, if a number of matched digital values is zero, then no program pulse is applied to a cell in the first block of memory cells.

Figure 10A:
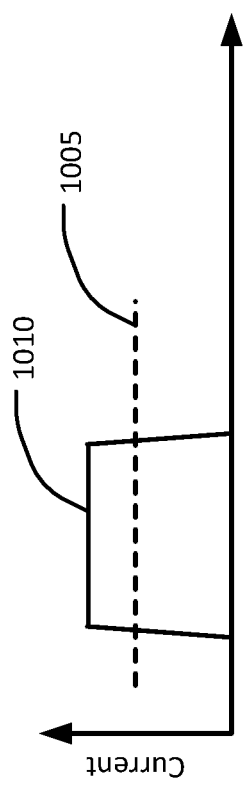
FIGS. 10A, 10B and 10C illustrate example pulse shapes of set pulses for changing the resistance level of a cell having a body of phase change material.
Figure 10B:
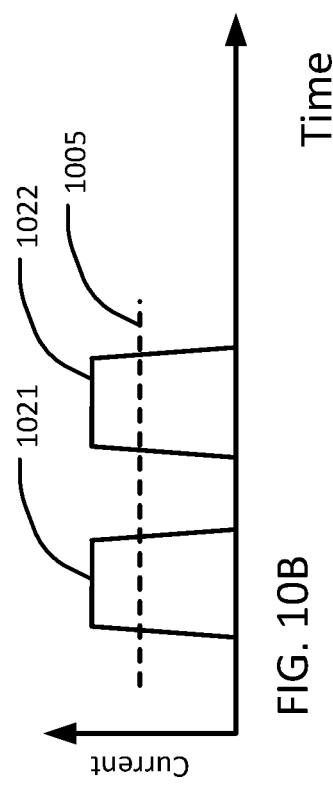
Figure 10C:
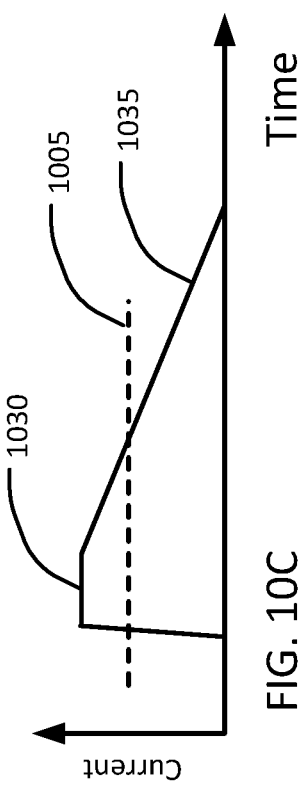

FIGS. 10A, 10B and 10C illustrate example pulse shapes of set pulses for changing the resistance level of a cell having a body of phase change material. FIG. 10A illustrates a single set pulse 1010 having a relatively long pulse duration and rapid rising and falling edges, with an amplitude above a melting threshold 1005 for the phase change material. FIG. 10B illustrates a sequence of set pulses 1021 and 1022 having a shorter pulse duration than the single set pulse 1010 in FIG. 10A. FIG. 10C illustrates a single set pulse with a rapid rising edge and a ramp-shaped trailing edge or a set tail 1035 of constant or near constant slope. For instance, a tail length of a set tail 1035 can vary between 10 ns and 1 ms, according to the differences in analog levels between the filter array and the particular frame of cells in the input array stored in the fifth block of memory cells.

Figure 11:
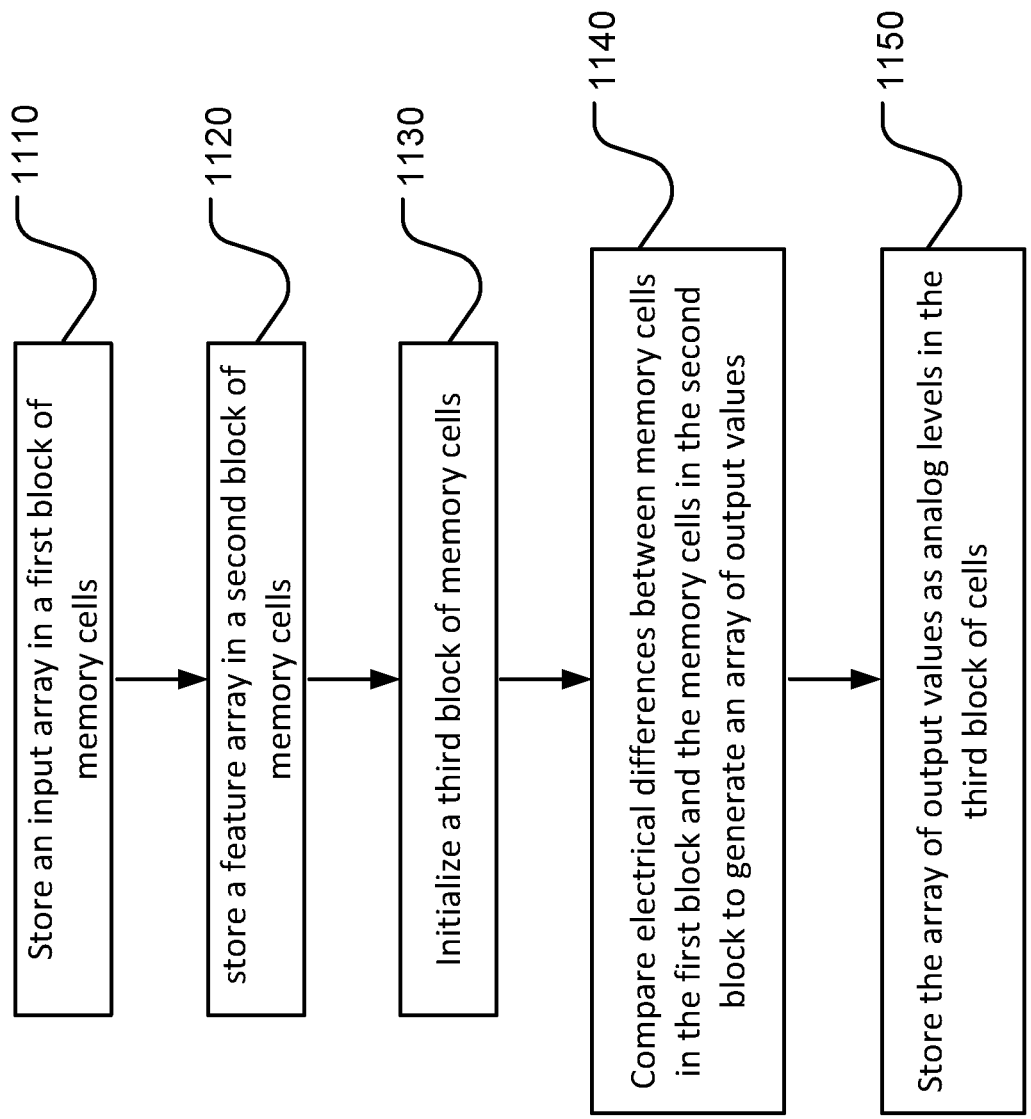
FIG. 11 illustrates a simplified flowchart for a flow in operating a device.

FIG. 11 illustrates a simplified flowchart for a flow in operating a device. At Step 1110, an input array can be stored in a first block of memory cells. At Step 1120, a feature array can be stored in a second block of memory cells.

At Step 1130, the third block of memory cells 130 can be initialized. The third block of memory cells can comprise programmable resistance memory cells having resistance levels, or charge storage memory cells having threshold voltage levels. Where the analog levels in the third block of memory cells include resistance levels, Step 1130 can include setting the third block of memory cells to the highest resistance level, such as 1 MΩ. For example, the highest resistance level can represent the case where a number of matched digital values between the feature array and a particular frame of cells in the first block of memory cells is the same as the number of digital values in the feature array. Where the analog levels in the third block of memory cells include threshold voltage levels, Step 1130 can include erasing the third block of memory cells to the lowest threshold voltage level. For example, the lowest threshold voltage level can represent the case where a number of matched digital values between the feature array and a particular frame of cells in the first block of memory cells is zero.

The order of Steps 1110, 1120 and 1130 as shown in the flowchart does not indicate the order in which Steps 1110, 1120 and 1130 can be executed. For instance, Step 1130 can be executed before Step 1110, and Step 1110 can be executed after Step 1120.

At Step 1140, sensing circuitry coupled to the first block of memory cells and the second block of memory cells can compare electrical differences between memory cells in the first block and the memory cells in the second block to generate an array of output values. For a set of frames of cells in the first block, the sensing circuitry can compare electrical differences between the feature array with each frame in the set of frames to generate the array of output values, where each value in the array of output values corresponds to a frame in the set of frames, and indicates electrical differences between analog values from its corresponding frame and analog values from the feature array.

At Step 1150, the writing circuitry operatively coupled to the third block of memory cells 130 can store the array of output values in the third block of memory cells. An analog level can be stored in each cell of the third block for the array of output values. The writing circuitry (170, FIG. 1) can apply a sequence of write pulses for each cell in the third block having a number of write pulses determined according to a corresponding output value in the array of output values, where cells in the third block of memory cells can include resistance levels or threshold voltage levels. The writing circuitry can apply a sequence of write pulses for each cell in the third block having a pulse duration determined according to a corresponding output value in the array of output values, where cells in the third block of memory cells include resistance levels or threshold voltage levels. The writing circuitry can apply a sequence of write pulses for each cell in the third block having a tail length of a write pulse determined according to a corresponding output value in the array of output values, where the analog levels in the third block of memory cells include resistance levels.

Furthermore, the device can comprise a fourth block of memory cells to store a filter array and a fifth block of memory cells to store an input array. Convolution circuitry is operatively coupled to the fourth block of memory cells and the fifth block of memory cells to generate an array of convolved values. The flow can include executing in-place convolution of a function of the filter array over the input array to generate an array of convolved values, and storing the array of convolved values in the first block. The flow can continue to compare electrical differences between the array of convolved values stored in the first block of memory cells and a feature array stored in the second block of memory cells to generate the array of output values, and store the array of output values in the third block of memory cells.

The input array stored in the fifth block of memory cells and the filter array can include digital values, and the convolution circuitry can receive the digital values as inputs to the function. For a set of frames of cells in the input array, the function can convolve the filter array with each frame in the set of frames to generate the array of convolved values, where each value in the array of convolved values corresponds to a frame in the set of frames, and indicates a number of digital values from its corresponding frame that matches corresponding digital values from the filter array. The flow includes applying addresses for the set of frames in the input array and the filter array to the fifth block and the fourth block in coordination with the in-place convolution.

Figure 12:
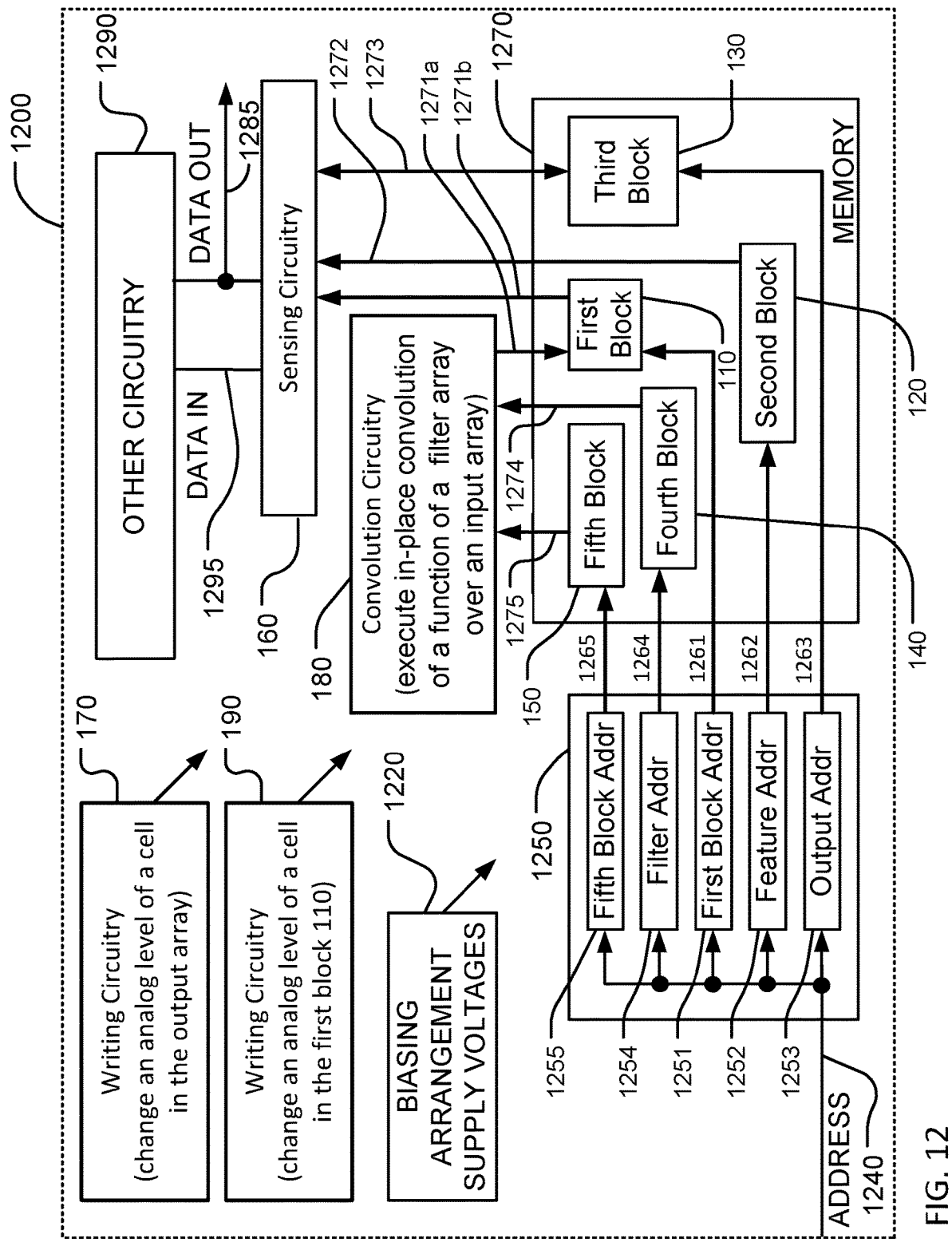
FIG. 12 is a simplified block diagram of an integrated circuit in accordance with the present technology.

FIG. 12 is a simplified block diagram of an integrated circuit in accordance with the present technology. In the example shown in FIG. 12, the integrated circuit 1200 includes a memory 1270. The memory 1270 comprises a first block of memory cells 110, a second block of memory cells 120 to store a feature array, a third block of memory cells 130 to store an array of output values, a fourth block of memory cells 140 to store a filter array, and a fifth block of memory cells 150. In one embodiment, the first block of memory cells 110 is configured to store an input array. In an alternative embodiment, the fifth block of memory cells 150 is configured to store an input array. In one embodiment, the filter array and the feature array can be the same array.

The integrated circuit 1200 includes address generation circuits 1250 that apply addresses for the set of frames in the input array stored in the first block of memory cells and the feature array to the first block and the second block in coordination with the sensing circuitry comparing the electrical differences. Address generation circuits 1250 can also apply addresses for the set of frames in the input array stored in the fifth block and the filter array to the fifth block and the fourth block in coordination with the in-place convolution.

Address generation circuits 1250 can include a first block address generator 1251, a feature array address generator 1252, an output array address generator 1253, a filter address generator 1254, and a fifth block address generator 1255. The first block address generator 1251 is coupled to address lines 1261 which in turn are coupled to the first block of memory cells 110. The feature array address generator 1252 is coupled to address lines 1262 which in turn are coupled to the second block of memory cells 120. The output array address generator 1253 is coupled to address lines 1263 which in turn are coupled to the third block of memory cells 130. The filter address generator 1254 is coupled to address lines 1264 which in turn are coupled to the fourth block of memory cells 140. A fifth block address generator 1255 is coupled to address lines 1265 which in turn are coupled to fifth block 150. Addresses are supplied on bus 1240 to the first block address generator 1251, the feature array address generator 1252, the output array address generator 1253, the filter address generator 1254, and the fifth block address generator 1255.

Convolution circuitry 180 is operatively coupled to the fourth block of memory cells 140, the fifth block of memory cells 150, and the first block of memory cells 110 via lines 1274, 1275 and 1271*a* respectively, for executing in-place convolution of a function of a filter array over the input array stored in the fifth block of memory cells to generate an array of convolved values. Sensing circuitry 160 is coupled to the first block of memory cells and the second block of memory cells via lines 1271*b* and 1272 respectively, for comparing electrical differences between the memory cells in the first block and the memory cells in the second block to generate an array of output values. The third block of memory cells 130 is coupled to the sensing circuitry 160 via lines 1273, for storing the array of output values in the third block of memory cells.

In one embodiment, the first block of memory cells 110, the second block of memory cells 120, the third block of memory cells 130, the fourth block of memory cells 140, and the fifth block of memory cells 150 can be configured in separate blocks of cells. The first block address generator 1251, the feature array address generator 1252, the output array address generator 1253, the filter address generator 1254, and the fifth block address generator 1255 can be separate address generators, including respective row decoders for word lines and column decoders for bit lines. In an alternative embodiment, the first block of memory cells 110, the second block of memory cells 120, the third block of memory cells 130, the fourth block of memory cells 140, and the fifth block of memory cells 150 can be configured in a common block of cells. In this embodiment, the first, second and third arrays of cells can share word lines coupled to a common row decoder, and have respective column decoders for bit lines coupled to respective arrays of cells.

Data is supplied via the data-in line 1295 from input/output ports on the integrated circuit 1200 or from other data sources internal or external to the integrated circuit 1200, to the first block of memory cells 110, the second block of memory cells 120, the third block of memory cells 130, the fourth block of memory cells 140, and the fifth block of memory cells 150. Data supplied via the data-in line 1295 can include an input array to be stored in the first block of memory cells 110 or the fifth block of memory cells 150, a filter array to be stored in the fourth block of memory cells 140, and a feature array to be stored in the second block of memory cells 120. In the illustrated embodiment, other circuitry 1290 is included on the integrated circuit, such as a general purpose processor or special purpose application circuitry, or a combination of modules providing system-on-a-chip functionality supported by the memory array. Data is supplied via the data-out line 1285 from the sensing circuitry 160 to input/output ports on the integrated circuit 1200, or to other data destinations internal or external to the integrated circuit 1200. Data supplied via the data-out line 1285 can include the array of output values stored in the third block of memory cells 130.

Convolution circuitry 180 can execute in-place convolution of a function of the filter array over the input array stored in the fifth block of memory cells to generate an array of convolved values. Writing circuitry 170 operatively coupled to the third block 130 can change an analog level of a cell in the output array. Writing circuitry 190 operatively coupled to the first block 110 can change an analog level of a cell in the first block 110. In one embodiment, writing circuitry 170 and writing circuitry 190 can be the same writing circuitry. Convolution circuitry 180, writing circuitry 170 and writing circuitry 190 implemented in this example using bias arrangement state machine control the application of bias arrangement supply voltages 1220 generated or provided through the voltage supply or supplies in block 1220, such as read, program and erase voltages.

Convolution circuitry 180 and writing circuitry 170 can be implemented using special-purpose logic circuitry as known in the art. In alternative embodiments, convolution circuitry 180 and writing circuitry 170 can comprise a general-purpose processor, which can be implemented on the same integrated circuit to control the operations of the device. In yet other embodiments, a combination of special-purpose logic circuitry and a general-purpose processor can be utilized for implementation of convolution circuitry 180 and writing circuitry 170.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
a first block of memory cells;
a second block of memory cells to store a feature array;
a third block of memory cells to store an array of output values at analog levels;
sensing circuitry coupled to the first block of memory cells and the second block of memory cells to compare electrical differences between the memory cells in the first block and the memory cells in the second block to generate the array of output values; and
writing circuitry operatively coupled to the third block to store the array of output values in the third block of memory cells.

2. The device of claim 1, wherein
for a set of frames of cells in the first block, the sensing circuitry is configured to compare electrical differences between the feature array with each frame in the set of frames to generate the array of output values, where each value in the array of output values corresponds to a frame in the set of frames, and indicates electrical differences between analog values from its corresponding frame and analog values from the feature array.

3. The device of claim 2, including address generation circuits that apply addresses for the set of frames and the feature array to the first block and the second block in coordination with the sensing circuitry comparing the electrical differences.

4. The device of claim 1, wherein the first block is configured to store an input array.

5. The device of claim 1, comprising:
a fourth block of memory cells to store a filter array;
a fifth block of memory cells to store an input array;

convolution circuitry operatively coupled to the fourth block of memory cells and the fifth block of memory cells to execute in-place convolution of a function of the filter array over the input array to generate an array of convolved values; and writing circuitry operatively coupled to the first block of memory cells to store the array of convolved values in the first block.

6. The device of claim 5, wherein the input array and the filter array include digital values, and the convolution circuitry receives the digital values as inputs to the function; and for a set of frames of cells in the input array, the function convolves the filter array with each frame in the set of frames to generate the array of convolved values, where each value in the array of convolved values corresponds to a frame in the set of frames, and indicates a number of digital values from its corresponding frame that matches corresponding digital values from the filter array.

7. The device of claim 6, including address generation circuits that apply addresses for the set of frames in the input array and the filter array to the fifth block and the fourth block in coordination with the in-place convolution.

8. The device of claim 1, wherein the writing circuitry operatively coupled to the third block is configured to store an analog level in each cell of the third block for the array of output values.

9. The device of claim 1, wherein the writing circuitry applies a sequence of write pulses for each cell in the third block having a number of write pulses determined according to a corresponding output value in the array of output values.

10. The device of claim 1, wherein the writing circuitry applies a sequence of write pulses for each cell in the third block having a pulse duration determined according to a corresponding output value in the array of output values.

11. The device of claim 1, wherein the writing circuitry applies a sequence of write pulses for each cell in the third block having a tail length of a write pulse determined according to a corresponding output value in the array of output values.

12. The device of claim 1, wherein the first, second and third blocks of memory cells are implemented on a single integrated circuit or multichip module under one package.

13. A method of operating a device comprising a first block of memory cells, a second block of memory cells to store a feature array, and a third block of memory cells to store an array of output values at analog levels, the method comprising:

comparing electrical differences between memory cells in the first block and the memory cells in the second block to generate the array of output values; and storing the array of output values in the third block of memory cells.

14. The method of claim 13, comprising:

for a set of frames of cells in the first block, comparing electrical differences between the feature array with each frame in the set of frames to generate the array of output values, where each value in the array of output values corresponds to a frame in the set of frames, and indicates electrical differences between analog values from its corresponding frame and analog values from the feature array.

15. The method of claim 14, comprising:

applying addresses for the set of frames and the feature array to the first block and the second block in coordination with the sensing circuitry comparing the electrical differences.

16. The method of claim 13, comprising:

storing an input array in the first block of memory cells.

17. The method of claim 13, wherein the device comprises a fourth block of memory cells to store a filter array and a fifth block of memory cells to store an input array, the method comprising:

executing in-place convolution of a function of the filter array over the input array to generate an array of convolved values; and storing the array of convolved values in the first block.

18. The method of claim 17, wherein the input array and the filter array include digital values, the method comprising:

receiving the digital values as inputs to the function; and for a set of frames of cells in the input array, convolving the filter array with each frame in the set of frames to generate the array of convolved values, where each value in the array of convolved values corresponds to a frame in the set of frames, and indicates a number of digital values from its corresponding frame that matches corresponding digital values from the filter array.

19. The method of claim 18, comprising:

applying addresses for the set of frames in the input array and the filter array to the fifth block and the fourth block in coordination with the in-place convolution.

20. The method of claim 13, comprising:

storing an analog level in each cell of the third block for the array of output values.

21. The method of claim 13, comprising:

applying a sequence of write pulses for each cell in the third block having a number of write pulses determined according to a corresponding output value in the array of output values.

22. The method of claim 13, comprising:

applying a sequence of write pulses for each cell in the third block having a pulse duration determined according to a corresponding output value in the array of output values.

23. The method of claim 13, comprising:

applying a sequence of write pulses for each cell in the third block having a tail length of a write pulse determined according to a corresponding output value in the array of output values.

* * * * *